US012701800B2

(12) United States Patent
Yamane

(10) Patent No.: US 12,701,800 B2
(45) Date of Patent: Aug. 4, 2026

(54) IMAGING DEVICE AND IMAGE GENERATION METHOD

(71) Applicant: Kioxia Corporation, Tokyo (JP)

(72) Inventor: Takeshi Yamane, Tsukuba Ibaraki (JP)

(73) Assignee: KIOXIA CORPORATION, Tokyo (JP)

( * ) Notice: Subject to any disclaimer, the term of this patent is extended or adjusted under 35 U.S.C. 154(b) by 165 days.

(21) Appl. No.: 18/821,587

(22) Filed: Aug. 30, 2024

(65) Prior Publication Data

US 2025/0120199 A1 Apr. 10, 2025

(30) Foreign Application Priority Data

Oct. 6, 2023 (JP) ................................. 2023-174623

(51) Int. Cl.
| | |
|---|---|
| *H10F 39/00* | (2025.01) |
| *H04N 23/30* | (2023.01) |
| *H04N 23/80* | (2023.01) |
| *H04N 25/711* | (2023.01) |
| *H04N 25/768* | (2023.01) |
| *H10F 39/18* | (2025.01) |

(52) U.S. Cl.
CPC ......... *H10F 39/8027* (2025.01); *H04N 23/80* (2023.01); *H04N 25/711* (2023.01); *H04N 25/768* (2023.01); *H04N 23/30* (2023.01); *H10F 39/189* (2025.01)

(58) Field of Classification Search
CPC .... H10F 39/8027; H04N 23/80; H04N 23/30; H04N 25/711; H04N 25/768
See application file for complete search history.

(56) References Cited

U.S. PATENT DOCUMENTS

| | | | |
|---|---|---|---|
| 2018/0261352 A1 | 9/2018 | Matsuyama et al. | |
| 2019/0064372 A1* | 2/2019 | Cao ......................... | G01T 1/242 |
| 2020/0033488 A1 | 1/2020 | Yamane | |
| 2023/0144201 A1* | 5/2023 | Yamane ................. | G01N 23/18 |
| | | | 378/62 |
| 2024/0096515 A1* | 3/2024 | Yamane ................... | G21K 7/00 |

FOREIGN PATENT DOCUMENTS

| | | |
|---|---|---|
| JP | 5846574 B2 | 1/2016 |
| JP | 6478433 B2 | 3/2019 |
| JP | 2020-016543 A | 1/2020 |
| JP | 7062547 B2 | 5/2022 |

* cited by examiner

*Primary Examiner* — Casey Bryant
(74) *Attorney, Agent, or Firm* — FOLEY & LARDNER LLP

(57) ABSTRACT

An imaging device includes a stage holding a subject; a detector including a first pixel layer, an insulating layer, and a second pixel layer stacked on top of one another; an image formation optical member configured to form an image of imaging light transmitted through the subject; and an image processor configured to reconstruct an image of the subject based on a detection intensity of the imaging light. The first pixel layer includes first linear pixels having linear light receiving surfaces extending in a first direction, and the first linear pixels are arranged with equal intervals from one another in a direction orthogonal to the first direction. The second pixel layer includes second linear pixels having linear light receiving surfaces extending in a second direction, and the second linear pixels are arranged with equal intervals from one another in a direction orthogonal to the second direction.

7 Claims, 19 Drawing Sheets

FIG. 2A

FIG. 15A
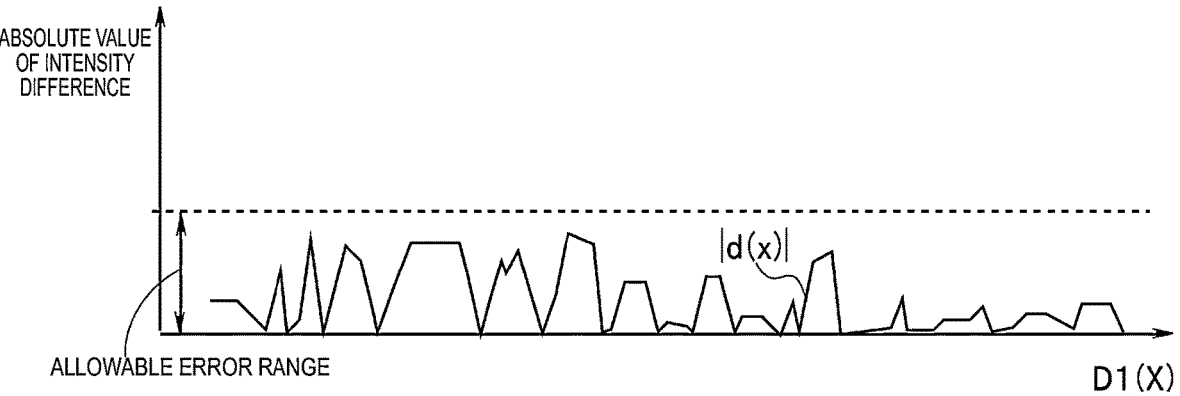
FIG. 15B
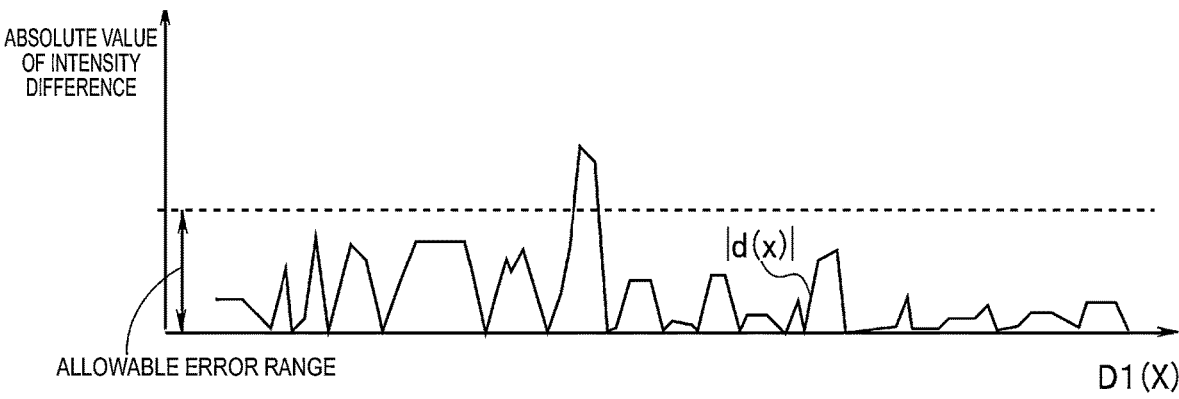
FIG. 16

ABSOLUTE VALUE
OF FOURIER
COMPONENT $A_1(u)$

B $u_1$

SPATIAL FREQUENCY $u_1$ $u_1$ $W(u)$

1

$-\dfrac{3}{L}$    $-\dfrac{2}{L}$    $-\dfrac{1}{L}$    0    $\dfrac{1}{L}$    $\dfrac{2}{L}$    $\dfrac{3}{L}$

SPATIAL FREQUENCY 171                      171

←----- 170

160

←----- 140

B      142      130     142      B'

D3

D2

D1

171

160

171

160

170

140

B          142          130     142          B'

D3

D1          D2

IMAGING DEVICE AND IMAGE GENERATION METHOD

CROSS-REFERENCE TO RELATED APPLICATION

This application is based upon and claims the benefit of priority from Japanese Patent Application No. 2023-174623, filed Oct. 6, 2023, the entire contents of which are incorporated herein by reference.

FIELD

Embodiments described herein relate generally to an imaging device and an image generation method.

BACKGROUND

A transmission X-ray microscope is known as a device for observing the structure of a subject with high resolution and nondestructively.

DESCRIPTION OF THE DRAWINGS

FIG. 2A is a schematic view showing an example of a subject.

FIG. 1 is a schematic view showing light amount correction of a detection intensity distribution using an integrated intensity distribution.

FIG. 15A is a view showing an example of a distribution of a difference.

FIG. 15B is a view showing an example of the distribution of the difference.

FIG. 16 is a view showing an example of a Fourier transform D(u) of a difference d(x).

DETAILED DESCRIPTION

Figure 1:
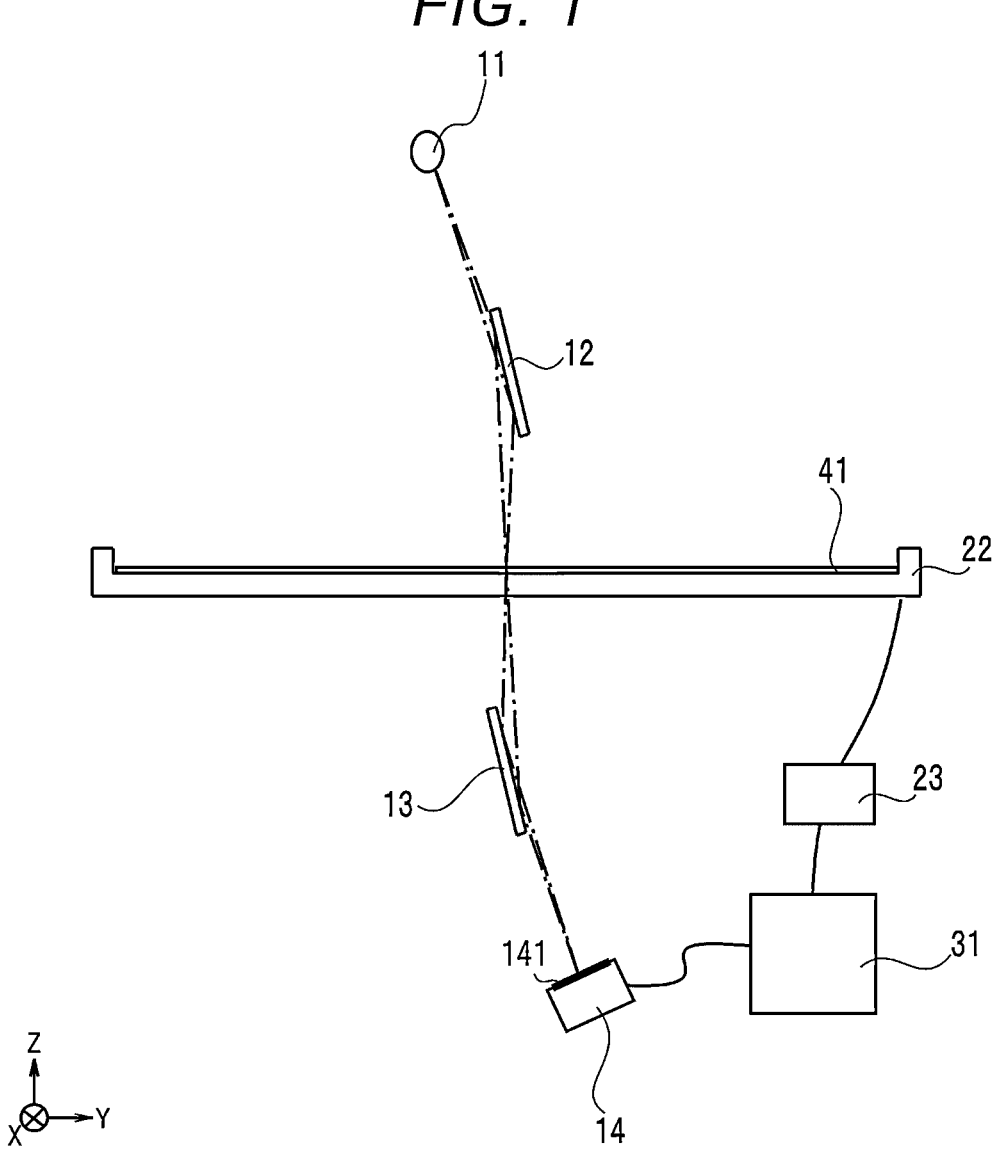
FIG. 1 is a schematic view showing an example of a configuration of an imaging device in a first embodiment.

Embodiments provide an imaging device and an image generation method that can acquire a reconstructed image with high accuracy.

In general, according to one embodiment, an imaging device includes a stage configured to hold a subject; a detector including a first pixel layer, an insulating layer, and a second pixel layer stacked on top of one another; an image formation optical member configured to form an image of imaging light transmitted through the subject; and an image processor configured to reconstruct an image of the subject based on a detection intensity of the imaging light detected by the detector. The first pixel layer includes a plurality of first linear pixels having linear light receiving surfaces extending in a first direction, and the plurality of first linear pixels are arranged with equal intervals from one another in a direction orthogonal to the first direction. The second pixel layer includes a plurality of second linear pixels having linear light receiving surfaces extending in a second direction, and the plurality of second linear pixels are arranged with equal intervals from one another in a direction orthogonal to the second direction. Respective widths of the first linear pixel and the second linear pixel in the first direction are different from each other. The stage is scannable in a direction parallel to the first direction. The detector is configured to output, for each sampling interval, a first detection intensity detected in the first pixel layer, and a second detection intensity detected in the second pixel layer. A distance that the stage is scanned at the sampling interval is shorter than a line length of the first linear pixel. The image processor is further configured to: assume that a first detection intensity distribution indicating the first detection intensity with respect to position coordinates of the stage is a convolution of a first image intensity distribution on a line extension line of the first linear pixel and a first window function showing 1 in a range of position coordinates of the stage corresponding to the line length of the first linear pixel and showing 0 in other ranges, and calculate the first image intensity distribution for each of the plurality of first linear pixels with a deconvolution from the first detection intensity distribution; correct the first image intensity distribution by using a second detection intensity distribution indicating the second detection intensity with respect to the position coordinates of the stage; and generate an image of the subject having a resolution in the first direction that is smaller than the line length of the first linear pixel by arranging the first image intensity distributions corrected in all the first linear pixels in an arrangement direction of the first linear pixels.

Hereinafter, embodiments will be described with reference to the accompanying drawings.

First Embodiment

The imaging device according to the embodiment is, for example, a transmission X-ray microscope. The transmission X-ray microscope is an image formation optical system using electromagnetic waves with short wavelengths, and has a high resolution of about several tens of nanometers. In addition, since X-rays have a high transmittance, it is possible to observe the surface structure and internal structure of a relatively thick subject such as a silicon wafer having a surface formed with a semiconductor device or the like.

FIG. 1 is a schematic view showing an example of a configuration of an imaging device in a first embodiment. The imaging device includes a light source 11, an illumination mirror 12, an image formation mirror 13, and a one-dimensional detector 14. In addition, the imaging device also includes a stage 22, a stage drive unit 23, and a control analysis unit 31. The light source 11 is an X-ray source that irradiates a target made of molybdenum or the like with an electron beam to generate X-rays. The illumination mirror 12 is used to collect the X-rays emitted from the light source 11 toward the subject 41 placed on the stage 22. For example, a Montel mirror is used for the illumination mirror 12.

Figure 2A:
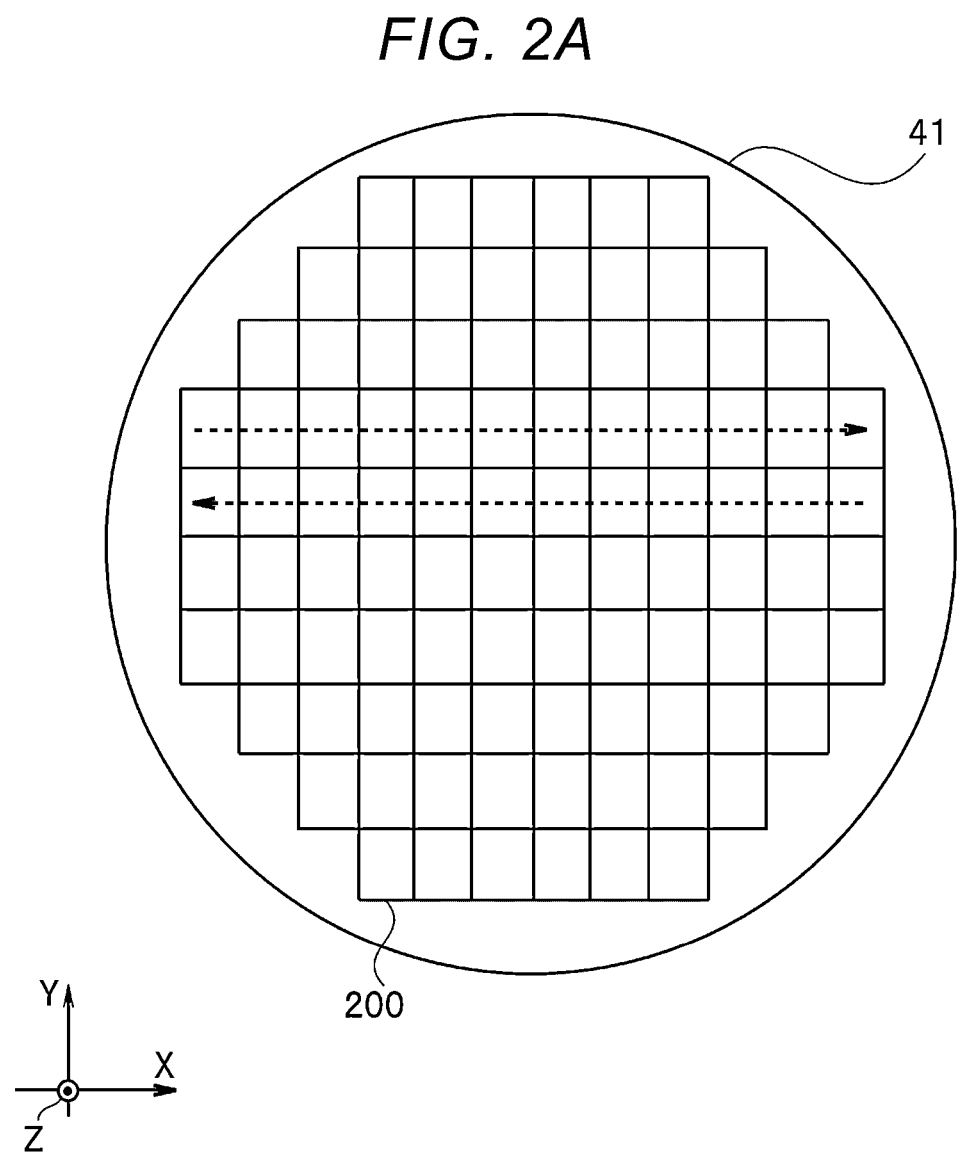

The subject 41 is, for example, a silicon wafer on which semiconductor devices are formed. FIG. 2A is a schematic view showing an example of a subject. A silicon wafer 41 which is the subject has a plurality of memory chip corresponding regions 200 arranged in a matrix in X and Y directions. The silicon wafer 41 is divided into a plurality of memory chips by dicing (die cutting) the silicon wafer 41 at the boundaries of the memory chip corresponding regions 200. Various processes are repeated on the silicon wafer 41, such as depositing various films by CVD technology, implanting impurities into various films by ion implantation technology, and patterning the deposited films by lithography technology and etching technology. As a result, a non-volatile memory is formed in each of the plurality of memory chip corresponding regions 200.

Figure 2B:
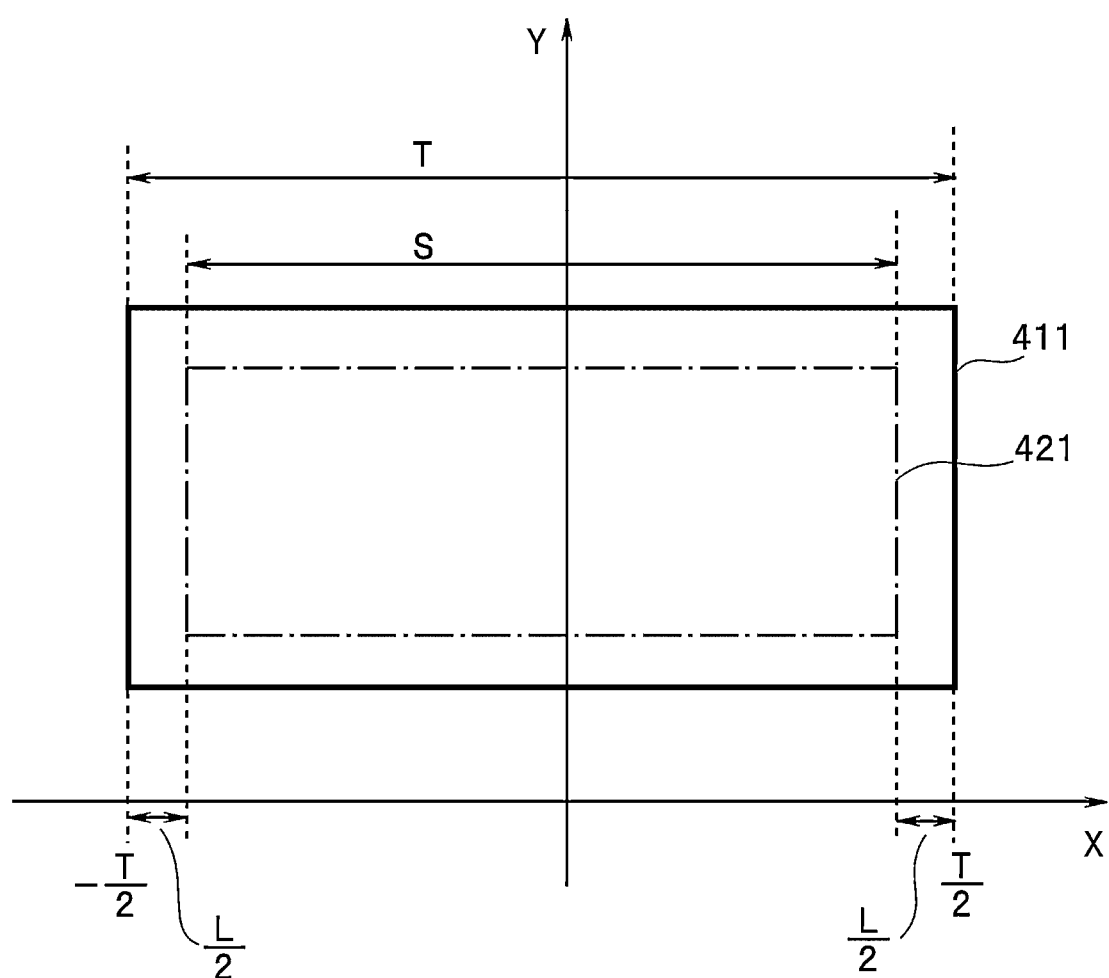
FIG. 2B is a schematic view showing a scanning region and an observation region set in the subject.

In the present embodiment, the silicon wafer 41 is placed on the stage 22 and observation is performed while moving the stage 22 in the X direction. For example, in a state in which the silicon wafer 41 is placed on the stage 22, an irradiation position of the X-ray on the silicon wafer 41 is moved by moving the stage 22 at a predetermined speed along the direction indicated by the dotted line with an arrow in FIG. 2A. FIG. 2B is a schematic view showing a scanning region and an observation region set in the subject. The observation region 421 is a region to be an observation target for the structure. In addition, the scanning region 411 is a region in which the subject 41 is irradiated with X-rays while being scanned in order to observe the structure of the observation region 421. More specifically, the range of the scanning region 411 in the X direction matches the range in which the center position of the X-ray applied to the subject 41 moves when the subject 41 is scanned and observed. The Y-direction range of the scanning region 411 matches the Y-direction range of the observation region 421 or the Y-direction detection range of the one-dimensional detector 14, whichever is larger. It is assumed that S is the length of the observation region 421 in the X direction, and T is the length of the scanning region 411 in the X direction.

Figure 3A:
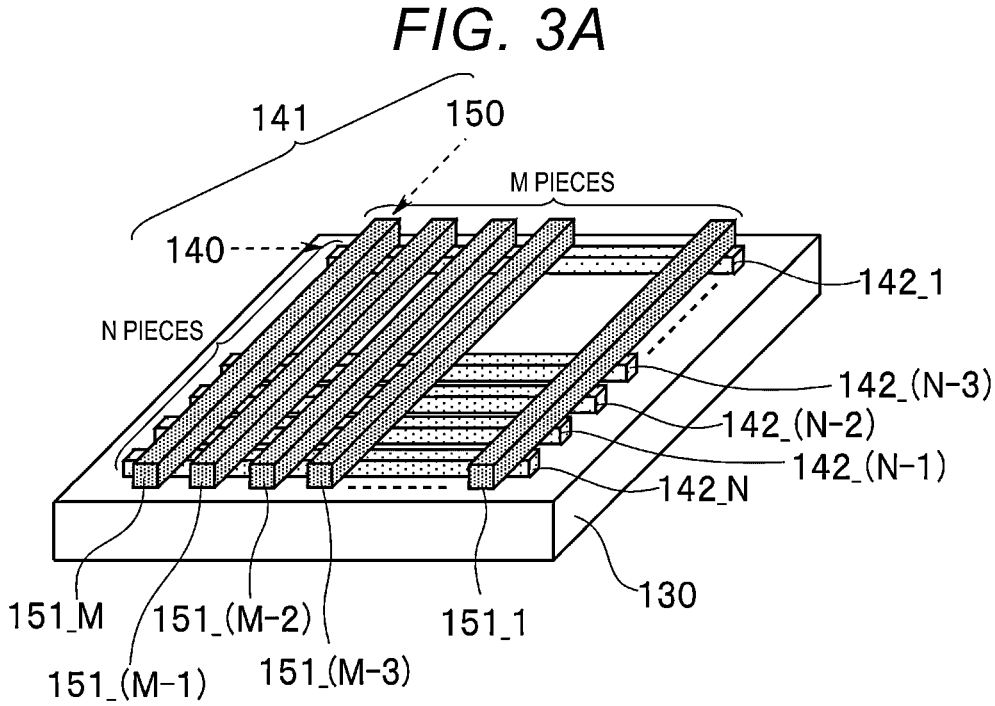
FIG. 3A is a schematic view showing a configuration of a one-dimensional detector in the first embodiment.
Figure 3A:
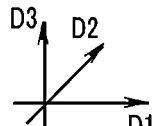
Figure 3B:
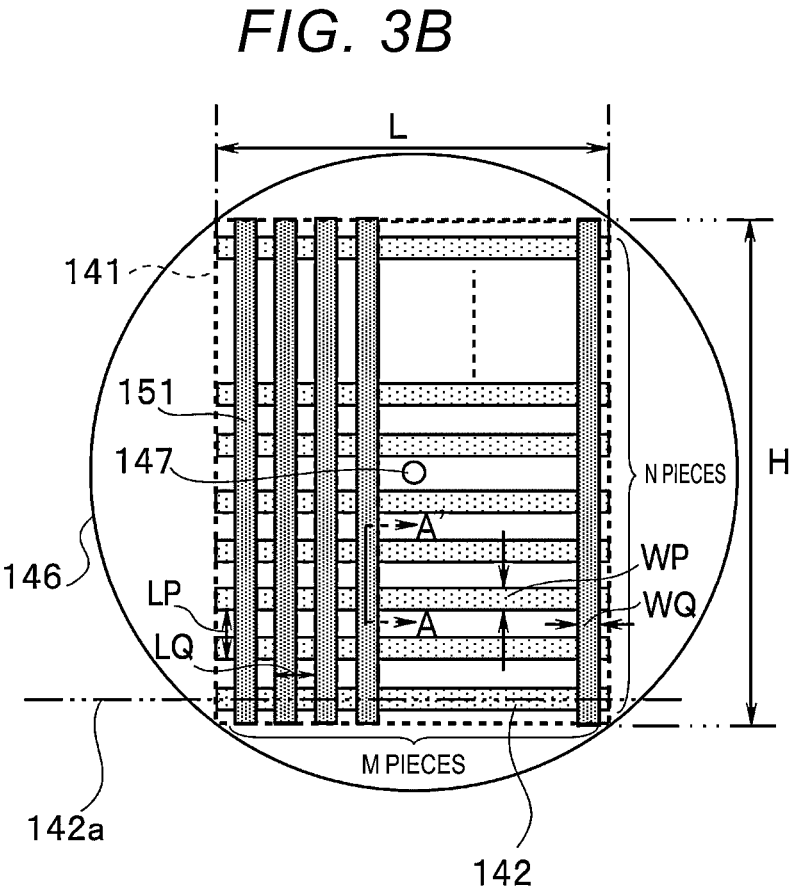
FIG. 3B is a plan view of the one-dimensional detector in the first embodiment as viewed from above in a D3 direction.
Figure 3B:
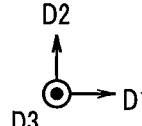
Figure 3C:
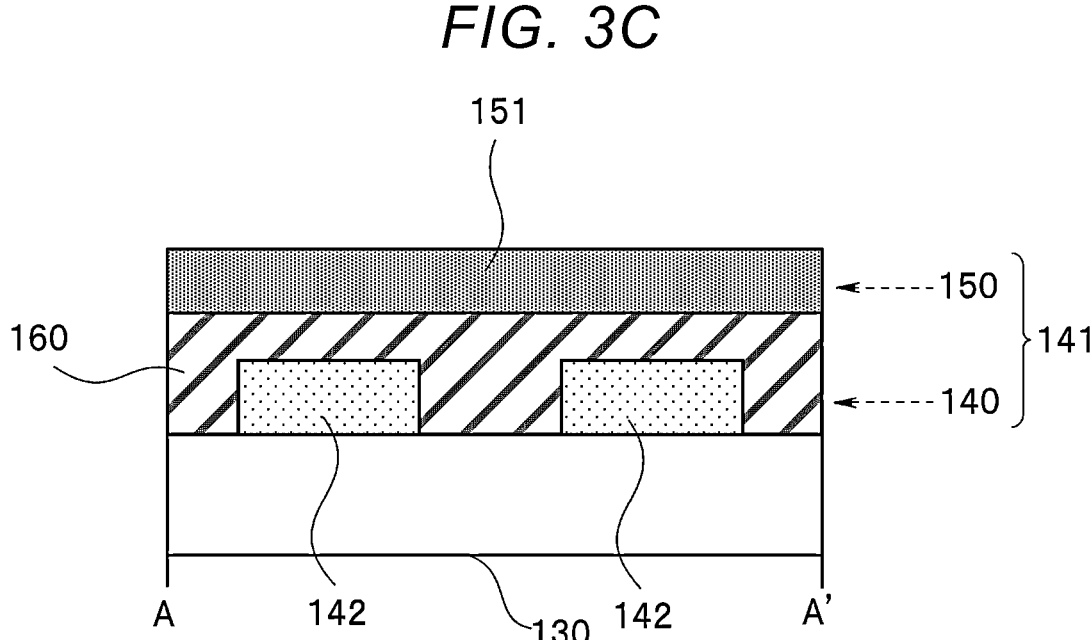
FIG. 3C is a sectional view taken along line A-A' of the one-dimensional detector shown in FIG. 3B.
Figure 3C:
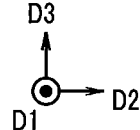

Referring again to FIG. 1, the detailed configuration of the imaging device according to the embodiment will be described. The image formation mirror 13 as an image formation optical member collects the X-rays that are transmitted through the subject 41, and forms an image of the subject 41 on the detection body 141 of the one-dimensional detector 14. FIG. 3A is a schematic view showing a configuration of a one-dimensional detector in the first embodiment. FIG. 3B is a plan view of the one-dimensional detector in the first embodiment as viewed from above in a D3 direction. FIG. 3C is a sectional view taken along line A-A' of the one-dimensional detector shown in FIG. 3B. The image of the subject 41 disposed parallel to an X-Y plane is formed on a D1-D2 plane of the detection body 141. In addition, the optical axis of the X-ray is incident on the subject 41 along the Z direction, and is incident on the detection body 141 of the one-dimensional detector 14 along a D3 direction. That is, the D1 direction of the detection body 141 corresponds to the X direction of the subject 41, the D2 direction of the detection body 141 corresponds to the Y direction of the subject 41, and the D3 direction of the detection body 141 corresponds to the Z direction of the subject 41. The D1 direction, the D2 direction, and the D3 direction are orthogonal to each other.

As shown in FIG. 3A, the one-dimensional detector 14 includes a substrate 130 and the detection body 141 having two pixel layers (first pixel layer 140 and second pixel layer 150). The first pixel layer 140 is formed on the substrate 130 made of silicon or the like, and the second pixel layer 150 is formed above the first pixel layer 140.

As shown in FIGS. 3A and 3B, the first pixel layer 140 is configured by arranging N (N is an integer of 2 or more) first linear pixels 142_1 to 142_N extending in the D1 direction at equal intervals in the D2 direction in the first pixel layer 140. The second pixel layer 150 is configured by arranging M (M is an integer of 2 or more) second linear pixels 151_1 to 151_M extending in the D2 direction at equal intervals in the D1 direction in the second pixel layer 150. In the following description, each of the first linear pixels 142_1 to 142_N may be referred to as the first linear pixel 142. Each of the second linear pixels 151_1 to 151_M may also be referred to as the second linear pixel 151. As shown in FIG. 3C, the surface of the first linear pixel 142 is covered with an insulating film 160 formed of a silicon oxide film or the like. The second linear pixel 151 is formed on the upper surface of the insulating film 160. That is, the plurality of first linear pixels 142 constituting the first pixel layer 140 are electrically separated from each other by the insulating film 160. In addition, the plurality of second linear pixels 151 constituting the second pixel are electrically separated from each other by the insulating film 160. Further, the first linear pixel 142 and the second linear pixel 151 are physically and electrically separated by the insulating film 160.

In the following description, a width of one first linear pixel 142 is defined as WP, and a sum of the width of one first linear pixel 142 and an interval between the adjacent first linear pixels 142 is defined as a pixel pitch LP. In addition, the length (line length) of the first linear pixel 142 is defined as L. Further, a width of one second linear pixel 151 is defined as WQ, and a sum of the width of one second linear pixel 151 and an interval between the adjacent second linear pixels 151 is defined as a pixel pitch LQ. In addition, the length (line length) of the second linear pixel 151 is defined as H. The length L is substantially equal to a product of the pixel pitch LQ and M, which is the number of the second linear pixels 151, and the length H is substantially equal to a product of the pixel pitch LP and N, which is the number of the first linear pixels 142. An area of the surface (upper surface) when the detection body 141 of the one-dimensional detector 14 is viewed from the D3 direction is L×H. The upper surface of the detection body 141 is set to have as large an area as possible within a region 146 irradiated with the X-rays emitted from the light source 11 so that X-rays are detected over as wide a range as possible.

For example, a superconducting nanostrip detector (superconducting single-photon detector) is used for the first linear pixel 142 and the second linear pixel 151. In this case, the width WP and a thickness (length in the D3 direction in FIG. 3A) of the first linear pixel 142 are determined such that a cross-sectional area of the first linear pixel 142 is reduced to a degree at which the superconducting region is divided. In addition, the width WQ and a thickness (length in the D3 direction in FIG. 3A) of the second linear pixel 151 are determined such that the superconducting region is divided.

Figure 4:
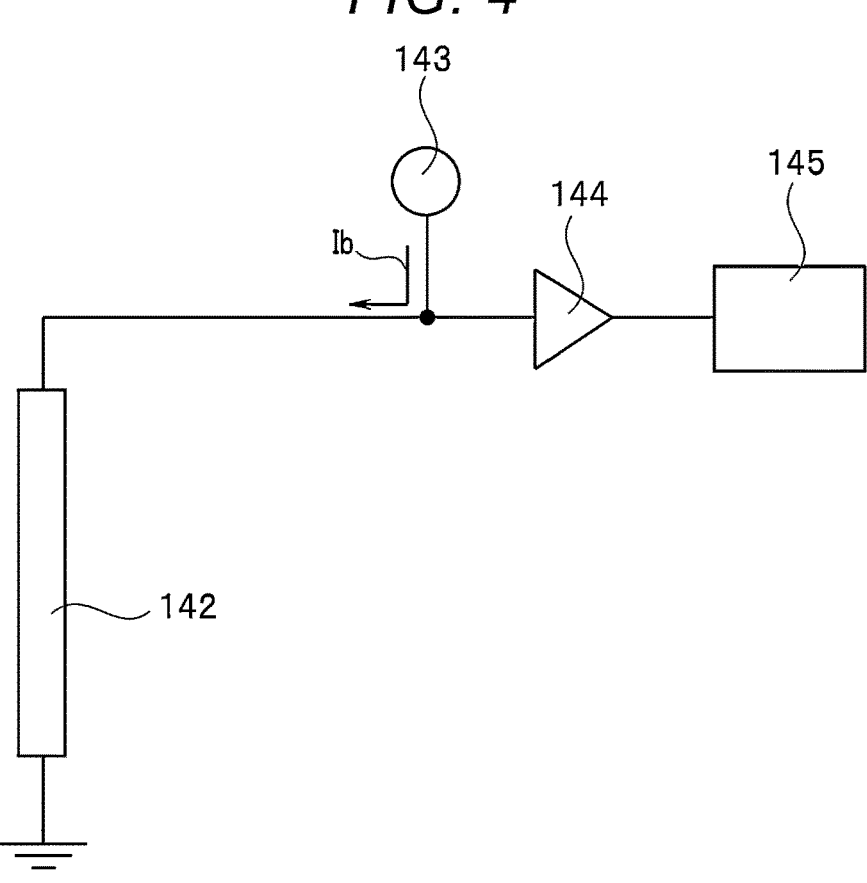
FIG. 4 is a principle circuit configuration view of the one-dimensional detector.

FIG. 4 is a principle circuit configuration view of the one-dimensional detector. FIG. 4 shows a circuit configuration when the superconducting nanostrip detector is used as the first linear pixel 142 and the second linear pixel 151. FIG. 4 shows one of a plurality of the disposed superconducting strips (first linear pixel) 142, and a current source 143, an amplifier 144, and a measuring device 145 corresponding to the one superconducting strip 142. As shown in FIG. 4, each superconducting strip 142 has one end which is grounded. The superconducting strip 142 has another end which is connected to the current source 143 and the amplifier 144. The current source 143 supplies bias current Ib to the superconducting strip 142. The amplifier 144 amplifies the electrical signal generated by the superconducting strip 142 and transmits an output signal (electrical signal) to the measuring device 145. The measuring device 145 counts pulsed output signals (electrical signals) transmitted from the amplifier 144 when X-ray photons are detected by the superconducting strip 142. The current source 143, the amplifier 144, and the measuring device 145 may also be provided outside the one-dimensional detector 14. For example, a configuration in which the current source 143, the amplifier 144, and the measuring device 145 are provided within the control analysis unit 31 may also be adopted.

Figure 5:
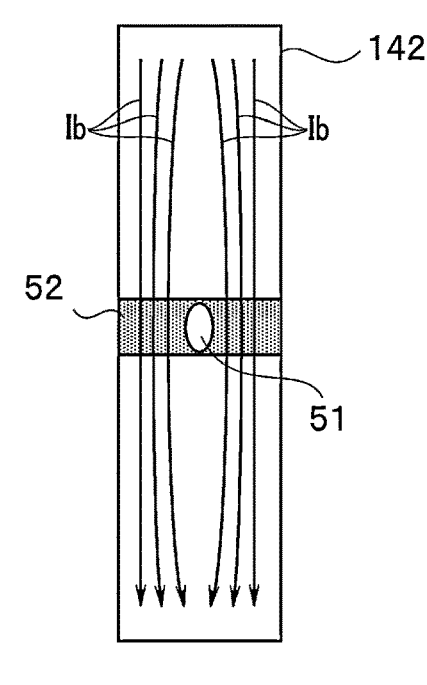
FIG. 5 is a view showing a detection principle of X-ray photons in a superconducting strip.

FIG. 5 is a view showing a detection principle of X-ray photons in a superconducting strip. First, the superconducting strip 142 is cooled to be equal to or lower than a critical temperature by a refrigerator (not shown) to be in a superconducting state. Then, the current source 143 supplies the bias current Ib that is slightly below the critical current for maintaining the superconducting state of the superconducting strip 142. In this state, X-ray photons are incident on the superconducting strip 142.

At this time, the width and thickness of the superconducting strip 142 are about 200 nm, and the cross-sectional area of the superconducting strip 142 is small. Therefore, when the X-ray photons are absorbed by the superconducting strip 142, as shown in FIG. 5, a region (hotspot region) 51 that transitions to normal conduction called a hotspot is formed in the superconducting region of the superconducting strip 142. Since the electrical resistance of the hotspot region 51 increases, as shown in FIG. 5, the bias current Ib bypasses the hotspot region 51 and flows in a bypass region 52, which is another region.

Then, when a current which is equal to or higher than the critical current flows through the bypass region 52, the bypass region 52 transitions to normal conduction, the electrical resistance increases, and finally the superconducting region of the superconducting strip 142 is divided. That is, a state (divided state) occurs in which the superconducting region of the superconducting strip 142 described above is divided. After that, the hotspot region 51 and the bypass region 52 that were transitioned to normal conduction rapidly disappear by cooling, so that the pulsed electrical signal is generated by a temporary electrical resistance generated by the division of the superconducting region of the superconducting strip 142. By amplifying the pulsed electrical signal with an amplifier 144 and counting the pulsed electrical signal with the measuring device 145, the number of X-ray photons can be detected. The circuit configuration and the detection principle of the X-ray photons of the superconducting strip (second linear pixel) 151 are the same as those of the superconducting strip (first linear pixel) 142 described above. The number of X-ray photons for each of the superconducting strips 142 and 151 counted by the measuring device 145, that is, the detection result of the one-dimensional detector 14 is output to the control analysis unit 31. Most of the X-rays reaching the second linear pixel 151 are transmitted through the second linear pixel 151, and some of the X-rays are absorbed by the second linear pixel 151 and are detected. In the first linear pixel 142, some of the X-rays, which are transmitted through the second linear pixel 151 or the insulating layer 160 and reach the first linear pixel, are absorbed and detected by the first linear pixel 142.

The control analysis unit 31 configured as an image processing unit (or images processor) can analyze a signal (detection result) output from the one-dimensional detector 14, and reconstruct the image (two-dimensional image) of the subject 41. For example, a personal computer having a central processing unit (CPU) and a memory (RAM) may be used as the control analysis unit 31. An operation of reconstructing the image of the subject 41 is performed by software, for example, by storing the operation in a memory in advance as a program and executing the operation in the CPU. In addition, the operation of reconstructing the image of the subject 41 may be performed by one or more processors configured as hardware. For example, it may be a processor configured as an electronic circuit, or a processor configured with an integrated circuit such as a field programmable gate array (FPGA). In addition, the control analysis unit 31 outputs a control signal to the stage drive unit 23 that moves the stage 22 in the X direction or the Y direction, and instructs a movement timing, a movement direction, a movement speed v, and the like.

Figure 6:
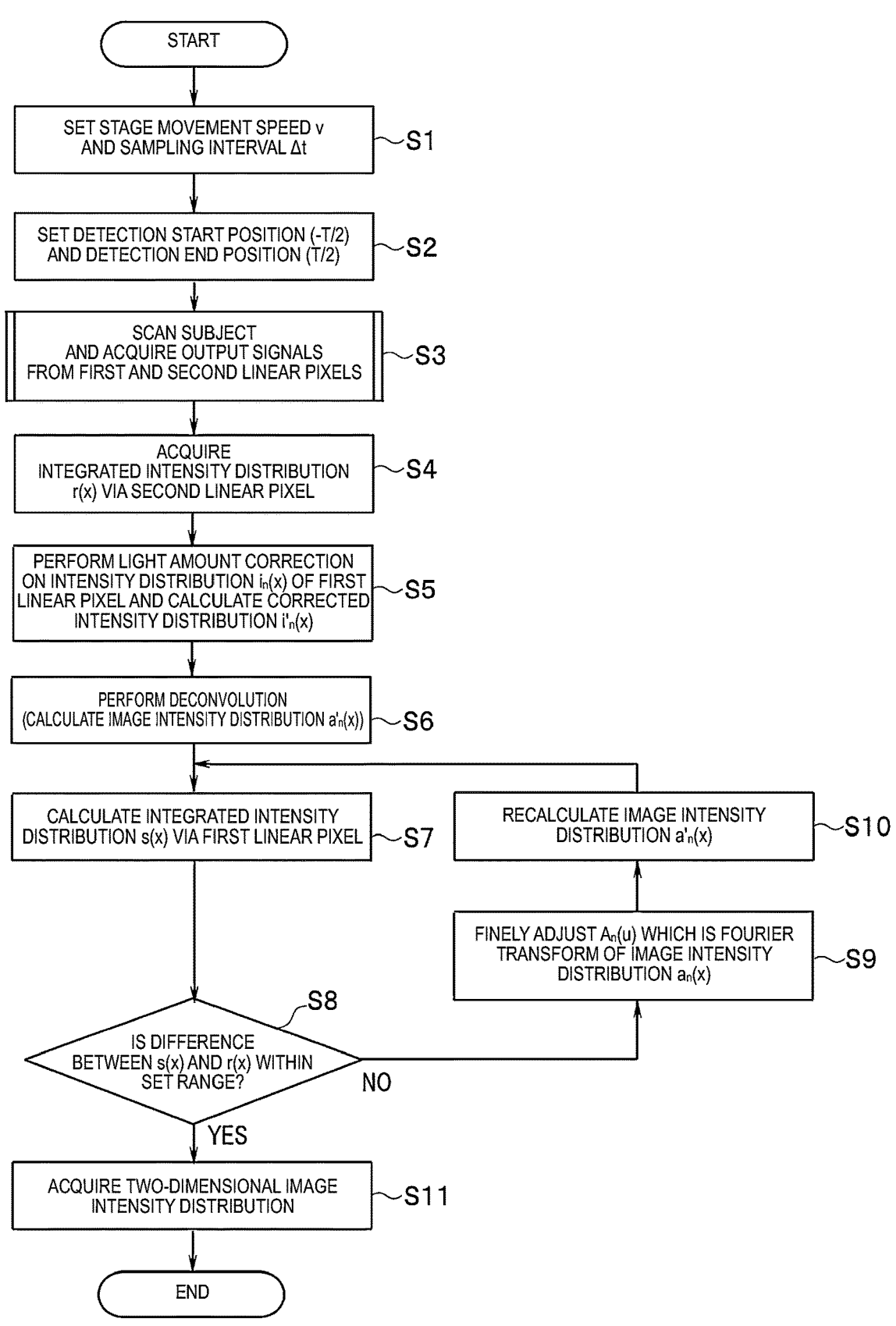
FIG. 6 is a flowchart showing an example of an image generation method in the first embodiment.

Next, an image generation method using the above-described imaging device will be described. FIG. 6 is a flowchart showing an example of the image generation method of the first embodiment. In the following description, x is the position on the D1(X) coordinate corresponding to the center 147 of the detection body 141 on the subject 41. In other words, x is a position on the X coordinate at which the X-ray incident on the center 147 of the detection body 141 is transmitted through the subject 41.

First, the subject 41 is placed on the stage 22, and the movement speed v of the stage 22 and the sampling interval $\Delta t$ are set. The movement speed v and the sampling interval $\Delta t$ are set such that the distance $v\Delta t$ by which the subject 41 moves for each sampling interval is smaller than the length L of the first linear pixel 142. At this time, when $v\Delta t$ and the pixel pitch LP are set to be the same, the grid intervals (resolution) in the X direction and in the Y direction in the finally obtained two-dimensional image intensity distribution are the same (S1). Then, a detection start position ($-T/2$) and a detection end position ($T/2$) are set (S2). Specifically, on the subject 41, for the X-coordinate position ($=x$) at which the X-rays incident on the center 147 of the detection body 141 on the subject 41 are transmitted through, a position at a time point of the start of detection and a position at a time point of the end of detection are set. S2 may also be described as the setting of the scanning region 411. Subsequently, the subject 41 is scanned, and the control analysis unit 31 acquires the output signals (detection intensities) from the first linear pixel 142 and the second linear pixel 151 (S3).

Figure 7:
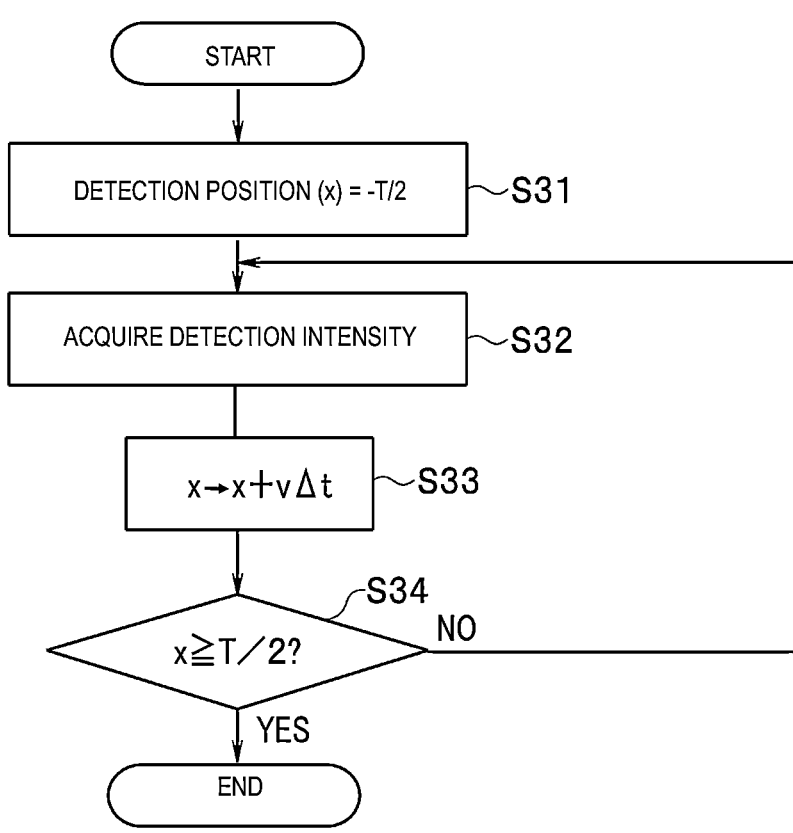
FIG. 7 is a flowchart showing an example of a detailed procedure in S3 of FIG. 6.

FIG. 7 is a flowchart showing an example of a detailed procedure in S3 of FIG. 6. First, the position of the stage 22 is adjusted so that x matches the detection start position (−T/2) set in S2 of FIG. 6 (S31), and the subject 41 is irradiated with X-rays from the light source 11, thereby acquiring the detection intensity output from the one-dimensional detector 14 (S32). When x is moved from the current coordinates to the positive side in the X direction by $v\Delta t$ which is the grid interval (S33) and the position of x after movement is not equal to or greater than the detection end position (T/2) set in S2 of FIG. 6 (S34, NO), the process returns to S32 and the detection intensity at the position after the movement is acquired. On the other hand, when the position of x after movement is equal to or greater than the detection end position (T/2) set in S2 (S34, YES), acquisition of the detection intensity in the set scanning region 411 ends.

In the above description, a case where the sampling intervals of the first linear pixel 142 and the second linear pixel 151 are the same is described. When the sampling intervals of the first linear pixel 142 and the second linear pixel 151 are different from each other, linear interpolation or the like is performed on the data having a coarser sampling interval, and the data is converted into data having the same sampling interval as the data having a finer sampling interval.

Figure 8A:
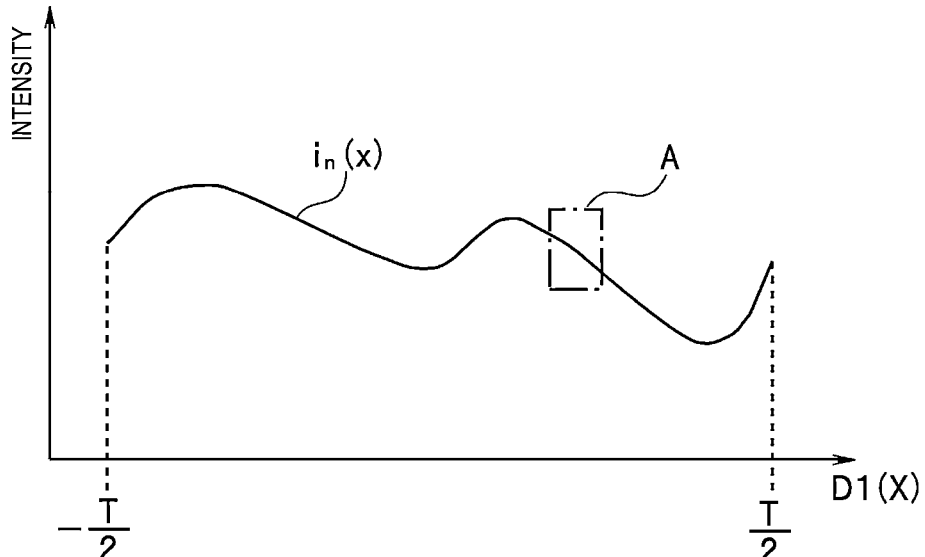
FIG. 8A is a view showing an example of a detection intensity distribution of a first linear pixel.
Figure 8B:
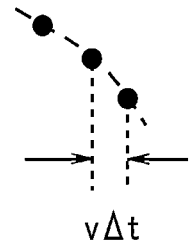
FIG. 8B is an enlarged view of a region A in FIG. 8A.

FIG. 8A is a view showing an example of a detection intensity distribution of a first linear pixel. In addition, that is, an example of the detection intensity distribution for one pixel out of the N superconducting strips (pixels) 142 in the detection body 141 is shown. FIG. 8B is an enlarged view of a region A in FIG. 8A. When a superconducting nanostrip detector is used as the one-dimensional detector 14 and one X-ray photon is detected in a certain pixel, one pulse signal is output. By setting the cumulative number of photons detected during a certain sampling interval $\Delta t$ as an intensity and plotting the intensity against the X coordinate, a detection intensity distribution $i_n(x)$ as shown in FIG. 8A is acquired. The detection intensity distribution $i_n(x)$ (where n is a natural number satisfying a relationship $1 \le n \le N$) is obtained for each of the N superconducting strips (first linear pixels) 142 in the detection body 141. When assuming that the scanning speed of the stage 22 is v, as shown in FIG. 8B, the detection intensity distribution $i_n(x)$ is discrete data with a grid interval of $v\Delta t$ for x (x=−T/2, −T/2+$v\Delta t$, −T/2+$2v\Delta t$, . . . , T/2−$v\Delta t$).

Figure 9:
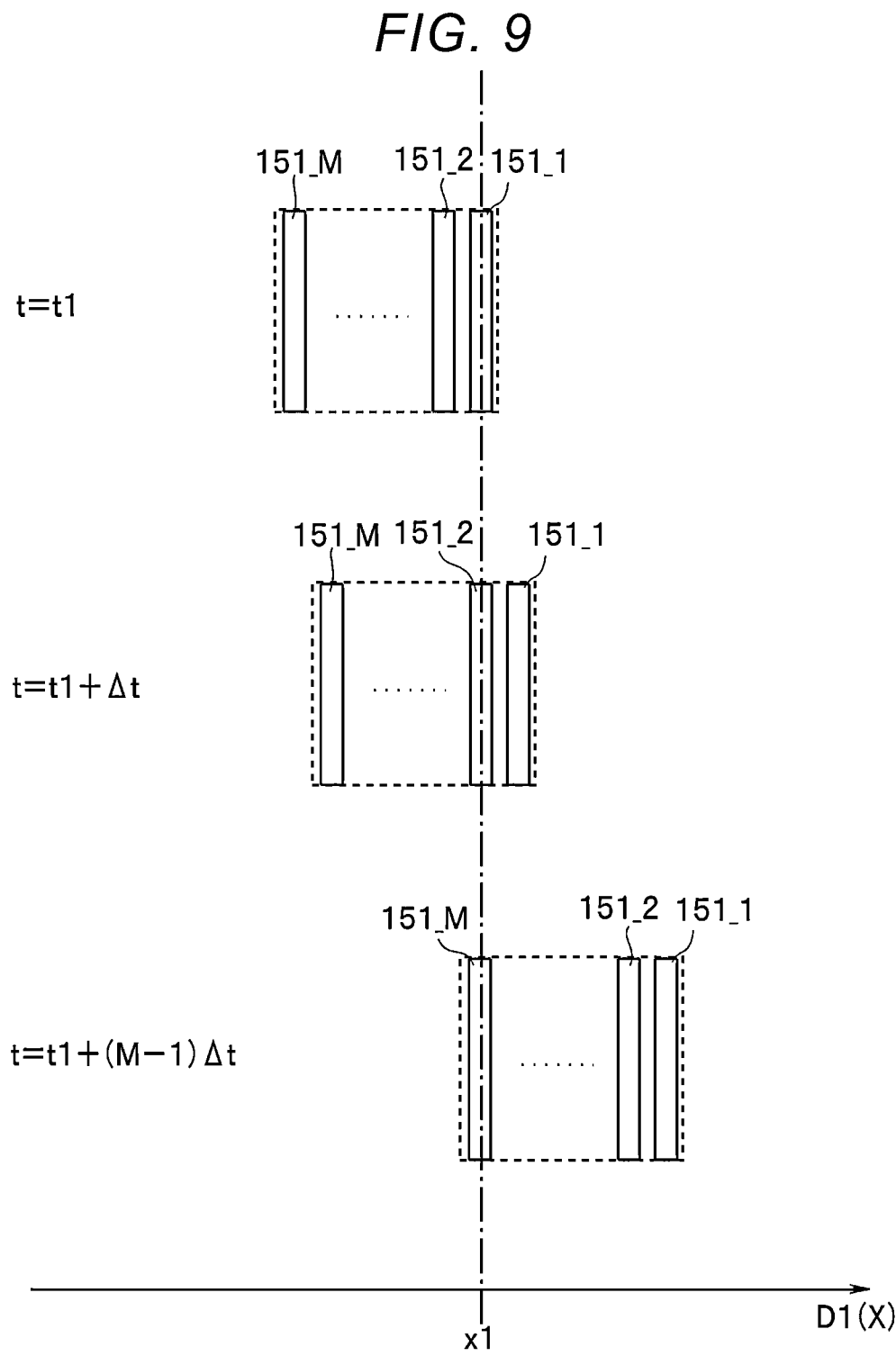
FIG. 9 is a schematic view showing a method of calculating an integrated intensity distribution with a TDI method.

Next, the integrated intensity distribution r(x) via the second linear pixel 151 is acquired (S4). The integrated intensity distribution r(x) is calculated from the intensity detected in the second linear pixel 151 by using a time delay integration (TDI) method. FIG. 9 is a schematic view showing a method of calculating an integrated intensity distribution with a TDI method. When the TDI method is used, the movement speed v and the sampling interval $\Delta t$ are determined in S1 such that the pixel pitch LQ of the second linear pixel 151 satisfies a relationship $LQ=v\Delta t$. As shown in the upper stage of FIG. 9, at a certain time t=t1, the intensity at the position of x=x1 on the subject 41 is detected in the second linear pixel 151_1. In this case, when $\Delta t$ elapses, the position of the subject 41 moves in the X direction by the pixel pitch LQ. Therefore, at t=t1+$\Delta t$, as shown in the middle stage of FIG. 9, the intensity at the position of x=x1 on the subject 41 is detected in the second linear pixel 151_2. As described above, the second linear pixel 151 for detecting the intensity at the position of x=x1 is shifted one by one at each sampling interval $\Delta t$, and as shown in the lower stage of FIG. 9, the second linear pixel 151 is the second linear pixel 151_M at t=t1+(M−1)$\Delta t$.

Therefore, when the intensity of the second linear pixel 151_m (where m is a natural number satisfying a relationship $1 \le m \le (M)$ at time t is denoted by jm(t), the sum of jm(t+(m−1)$\Delta t$) for $1 \le m \le M$ indicates the M-time integrated value of the intensity at a certain position on the subject 41. In this way, the method of obtaining the integrated intensity distribution is the TDI method, and the temporal intensity variations and the sensitivity variations of each pixel are averaged, and the intensity distribution with few variations can be acquired. The obtained integrated intensity is plotted with respect to the X coordinate on the subject to acquire the integrated intensity distribution r(x).

Figure 10:
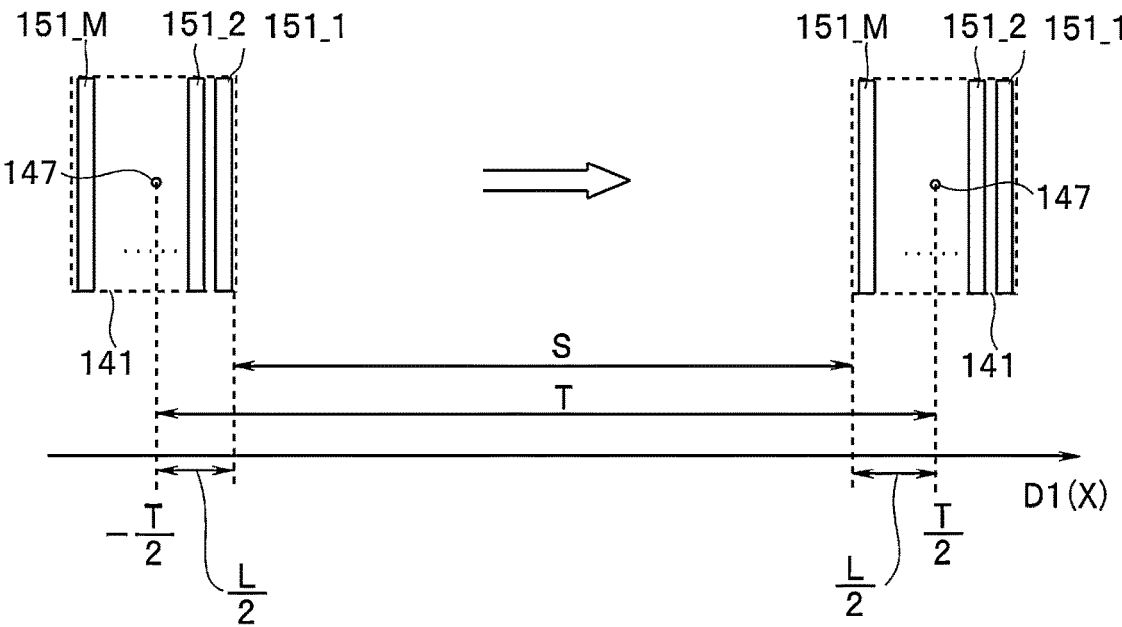
FIG. 10 is a view showing a range of an observation region in an X direction.

FIG. 10 is a view showing a range of an observation region in an X direction. As shown in FIG. 10, when the center 147 of the detection body 141 is scanned within the range of −T/2≤x<T/2, all M second linear pixels 151 pass through and are integrated M times within the range of −T/2+L/2≤x<T/2−L/2. That is, the length S of the observation region 421 in the X direction is shorter than the length T of the scanning region 411. Therefore, in the present embodiment, the two-dimensional image intensity distribution within a range of the observation region 421 is finally obtained.

Figure 11:
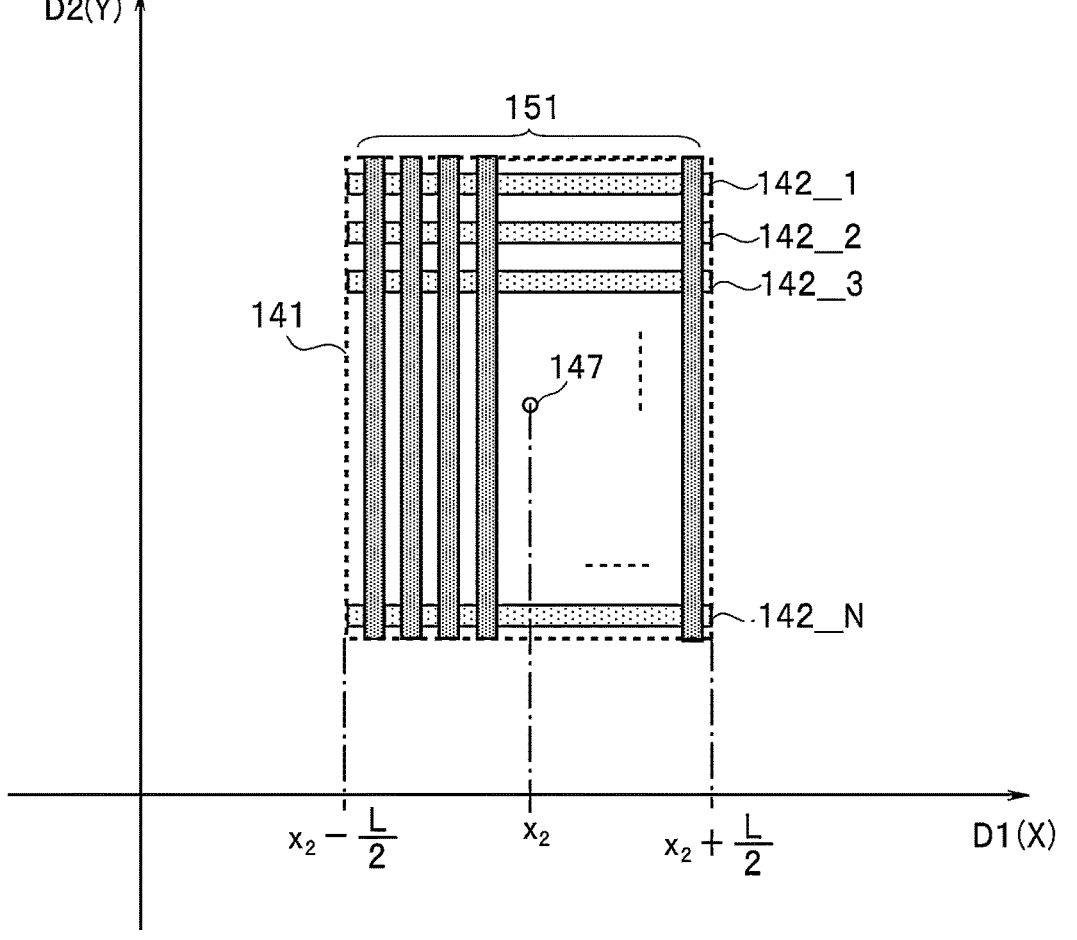

Next, the light amount correction of the detection intensity distribution $i_n(x)$ is performed (S5). Specifically, the light amount correction is performed using the integrated intensity distribution r(x) on the detection intensity distribution $i_n(x)$ obtained by plotting the detection intensity with respect to the X coordinate of the center position of the first linear pixel 142_n. At this time, the detection intensity is corrected by assuming that the intensity of the X-rays applied on the upper surface of the detection body 141 (hereinafter, referred to as the light amount in the detection body 141) uniformly fluctuates within the upper surface of the detection body 141 due to the temporal variations in the intensity of the X-rays emitted from the light source 11 (light amount fluctuation) when acquiring the detection intensity distribution $i_n(x)$. FIG. 11 is a schematic view showing light amount correction of a detection intensity distribution using an integrated intensity distribution. As shown in FIG. 11, when the X coordinate of the center 147 of the detection body 141 is x=$x_2$, a value obtained by multiplying the light amount in the detection body 141 by the detection efficiency of the first linear pixel 142 corresponds to the sum of the detection intensities $i_n(x_2)$ in each of the N first linear pixels 142_n. The detection efficiency of the first linear pixel 142 is a ratio of the sum of the intensities detected in the first linear pixel 142 with respect to the light amount in the detection body 141. Meanwhile, the integrated intensity r(x) is an integrated value of the intensity detected in the second linear pixel 151, and a value obtained by multiplying the light amount in the detection body 141 by the detection efficiency of the second linear pixel 151 corresponds to the sum of the integrated intensities r(x) for $-L/2+x_2 \le x < L/2+x_2$.

The detection intensity $i_n(x_2)$ is an intensity acquired during the sampling interval $\Delta t$ and is greatly affected by the temporal variations. Meanwhile, the integrated intensity r(x)

is an M-time integrated value of the intensity acquired at the sampling interval $\Delta t$, and is less affected by the temporal variations. Therefore, the detection intensity $i_n(x_2)$ is corrected with the integrated intensity $r(x)$ as a reference. The correction coefficient $k(x)$ is assumed not to depend on n in order to assume that the light amount fluctuation is uniform on the upper surface of the detection body 141, and the correction coefficient $k(x_2)$ is obtained as ((the sum of $r(x)$ for $-L/2+x_2 \leq x < L/2+x_2$)/(the sum of $i_n(x_2)$ for $1 \leq n \leq N$)). The detection intensity distribution $i'_n(x)$ $(-T/2+L/2 \leq x < T/2-L/2)$ subjected to light amount correction is obtained by multiplying the detection intensity $i_n(x)$ by the correction coefficient $k(x)$. The X-ray reaching the first linear pixel 142 is an X-ray that is transmitted through the second linear pixel 151 or the insulating layer 160, and the intensity thereof is lower than that of the X-ray reaching the second linear pixel 151 by the amount of X-ray absorbed by the second linear pixel 151 or the insulating layer 160, and the detection efficiency of the first linear pixel 142 is lower than the detection efficiency of the second linear pixel 151. Therefore, this light amount correction is not only for the light amount fluctuation, but also for the intensity when the detection efficiency of the first linear pixel 142 is the same as the detection efficiency of the second linear pixel 151.

Subsequently, a deconvolution is performed using the detection intensity distribution $i'_n(x)$ subjected to light amount correction to obtain the image intensity distribution $a'_n(x)$ on the line extension line of the first linear pixel 142 (on the straight line 142a indicated by the two-dot chain line in FIG. 3B) (S6). The image intensity distribution $a'_n(x)$ is calculated for each of the N first linear pixels 142_n. The detection intensity $i'_n(x_0)$ of the first linear pixel 142_n at a position $(x_0)$ on a certain X coordinate is represented by the following Equation (1) using the image intensity distribution $a_n(x)$ of the subject 41 whose image is formed on the line extension line of the first linear pixel 142_n and a window function $w(x)$ that is 1 in the interval $-L/2 \leq x \leq L/2$ and 0 in other intervals.

$$i_n(x_0) = \int a_n(x) \times w_n(x - x_0)dx \qquad (1)$$

Figure 12:
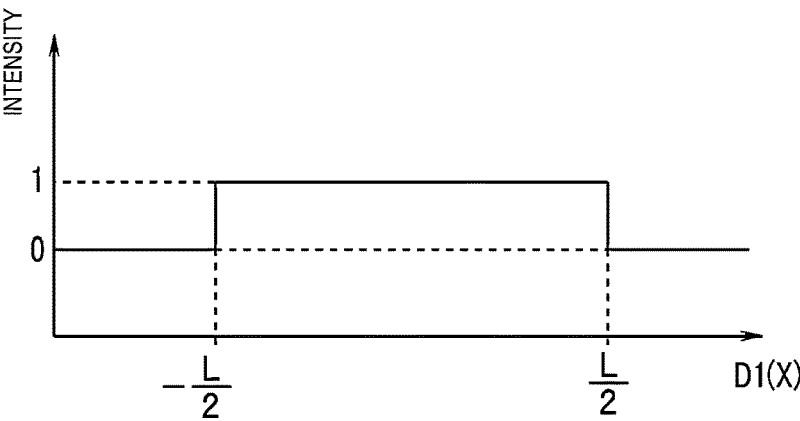
FIG. 12 is a view showing an example of a window function.

FIG. 12 is a view showing an example of a window function. As shown in Equation (1), $i_n(x)$ is the convolution of $a_n(x)$ and $w_n(x)$. When it is assumed that a spatial frequency in the X direction is u and the Fourier transforms of $i'_n(x)$, $a_n(x)$, and $w_n(x)$ are $I_n(u)$, $A_n(u)$, and $W_n(u)$, respectively, $I_n(u)$ is represented by the following Equation (2) according to the convolution theorem of the Fourier transform.

$$I_n(u) = A_n(u)W_n(u) \qquad (2)$$

By inverse Fourier transform of $A_n(u)$ obtained by $I_n(u)/W_n(u)$, the image intensity distribution $a'_n(x)$ on the line extension line of first linear pixel 142_n can be obtained.

Figure 13:
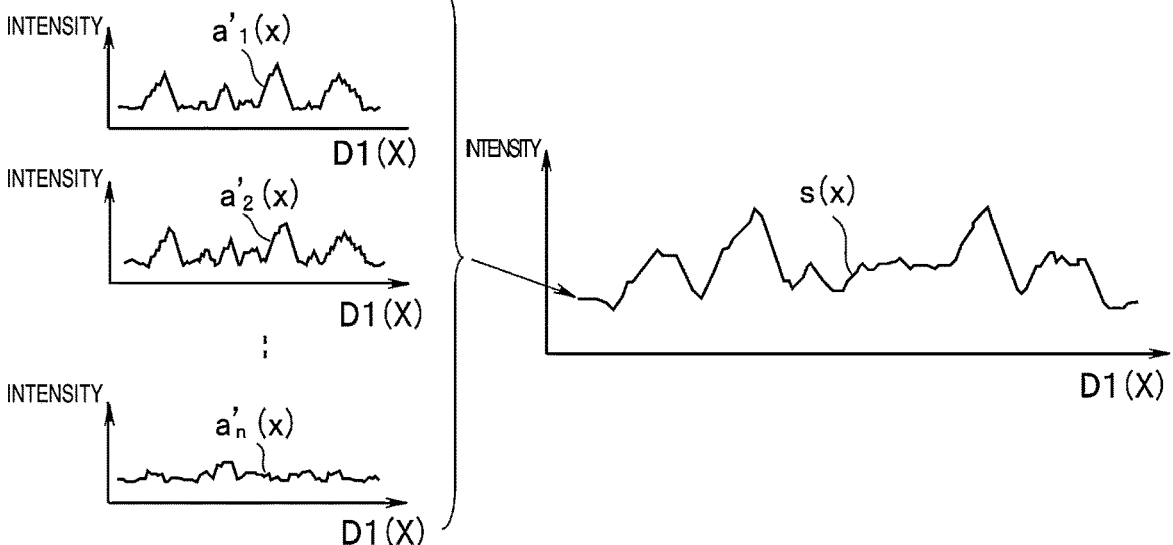
FIG. 13 is a view showing an example of an integrated intensity distribution of the first linear pixel.
Figure 14:
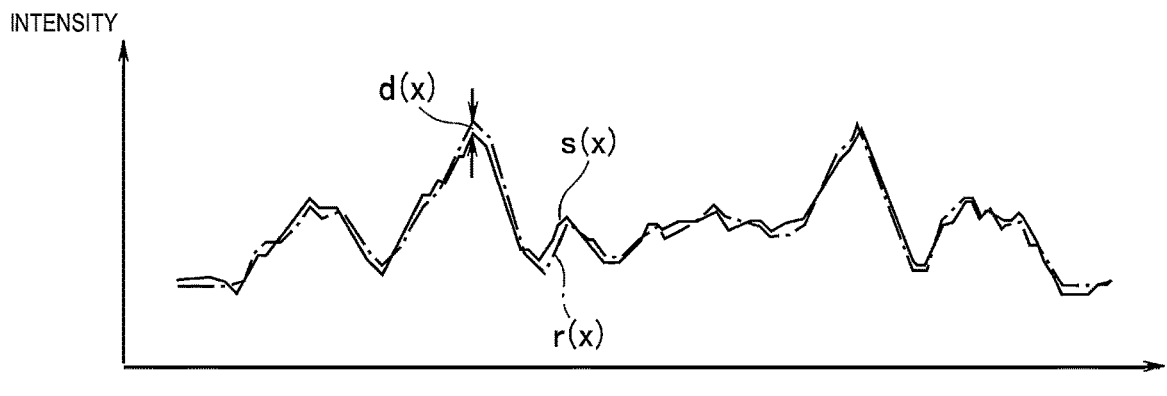
FIG. 14 is a view showing an example of two integrated intensity distributions.

The sum of the image intensity distributions $a'_n(x)$ for $1 \leq n \leq N$ is calculated, and the integrated intensity distribution $s(x)$ via the first linear pixel 142 is calculated (S7). FIG. 13 is a view showing an example of an integrated intensity distribution of the first linear pixel. Subsequently, a difference $d(x)$ between the integrated intensity distribution $s(x)$ via the first linear pixel 142 and the integrated intensity distribution $r(x)$ via the second linear pixel 151 is calculated. FIG. 14 is a view showing an example of two integrated intensity distributions. FIGS. 15A and 15B are views showing an example of a distribution of a difference. The integrated intensity distribution $r(x)$ has few variations and does not include an error due to a deconvolution. Therefore, as shown in FIG. 15A, when the difference $d(x)$ is within a predetermined allowable error range, the error of the integrated intensity distribution $s(x)$ is small, and it is determined that the image intensity distribution $a'_n(x)$ is obtained with sufficient accuracy (S8, YES), and the process proceeds to S11. On the other hand, as shown in FIG. 15B, when the difference $d(x)$ is not within the allowable error range (S8, NO), the process proceeds to S9.

In S9, $A_n(u)$ is finely adjusted. The S9 is specifically performed as follows. First, a Fourier transform $D(u)$ of the difference $d(x)$ is obtained. FIG. 16 is a view showing an example of the Fourier transform $D(u)$ of the difference $d(x)$. Next, a spatial frequency at which an absolute value of a Fourier component is maximum is specified. As shown in FIG. 16, for example, when $D(u)$ shows its maximum value at $u=u_1$, $A_n(u_1)$ is finely adjusted such that the difference $d(x)$ is reduced at the specified spatial frequency $u_1$.

Figures 17A, 17B, 17C, 18:
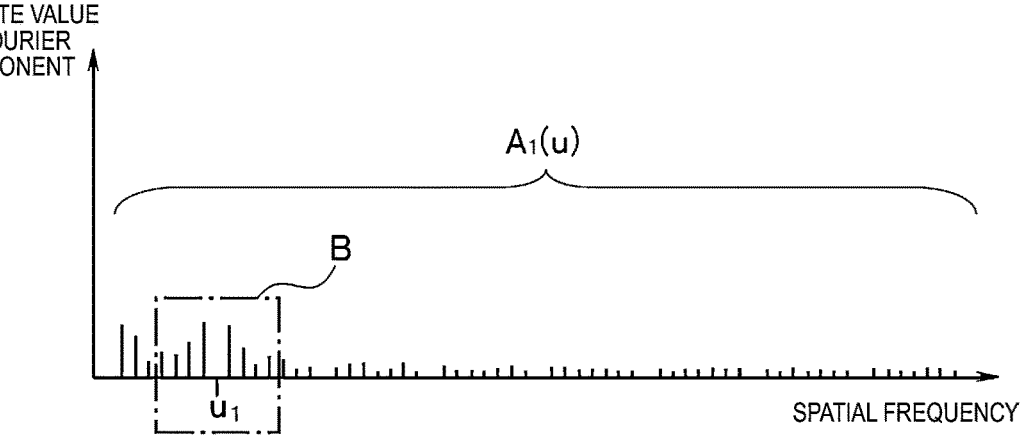
FIG. 17A is a view showing an example of A$_1$ (u) before fine adjustment.
FIG. 17B is an enlarged view of a region B in FIG. 17A.
FIG. 17C is an enlarged view of the region B in A$_1$ (u) after fine adjustment.
FIG. 18 is a view showing a Fourier transform W(u) of a window function w(x).

FIG. 17A is a view showing an example of $A_1(u)$ before fine adjustment, and FIG. 17B is an enlarged view of a region B in FIG. 17A. FIG. 17C is an enlarged view of the region B in $A_1(u)$ after fine adjustment. The constraint conditions during the fine adjustment are as follows. That is, at a certain X coordinate $(x=x_3)$, the difference between the sum of the image intensity distributions $a'_1(x)$ for $-L/2+x_3 \leq x < L/2+x_3$, which are obtained from $A_1(u)$ after the fine adjustment by using Equation (2), and the detection intensity $i'_1(x_3)$ is finely adjusted to be within a predetermined error range. This operation is performed in the same manner for all $A_n(u)$ for $1 \leq n \leq N$.

Here, the reason why an error occurs in $A_n(u)$ will be described. FIG. 18 is a view showing a Fourier transform $W(u)$ of a window function $w(x)$. As shown in FIG. 18, $W(u)$ has a Fourier component of zero when the spatial frequency is an integral multiple of $1/L$ assuming that the region of Fourier transform is 1. When the Fourier component is zero, the division of $I_n(u)/W_n(u)$ cannot be performed. Therefore, for example, a provisional value such as zero is put into $A_n(u)$. For example, when the spatial frequency $u_1$ is an integral multiple of $1/L$, as shown in FIGS. 17A and 17B, a provisional value such as zero is set in $A_n(u_1)$. Since the set provisional value is different from the actual value, an error occurs in $A_n(u)$. Further, when the light amount fluctuation is not uniform but locally occurs in the detection body 141, an error occurs in the detection intensity distribution $i'_n(x)$, and thus an error is included in $A_n(u)$. Furthermore, when $W(u)$ indicates a value close to zero, $1/W_n(u)$ is very large, so that the error included in the detection intensity distribution $i'_n(x)$ is magnified, and the error included in $A_n(u)$ is even larger. In the present embodiment, in order to eliminate the error caused by such a reason, $A_n(u)$ is finely adjusted in S9.

Subsequently, the image intensity distribution $a'_n(x)$ is recalculated from the $A_n(u)$ after fine adjustment obtained in S9 by using Equation (2) (S10). As a result, the adjusted image intensity distribution $a'_n(x)$ (n=1, 2, . . . . N) is obtained for each of the N first linear pixels 142_1 to 142_N. The process returns to S7, and the integrated intensity distribution $s(x)$ is calculated by using the image intensity distribution $a'_n(x)$ recalculated in S10.

Figure 19:
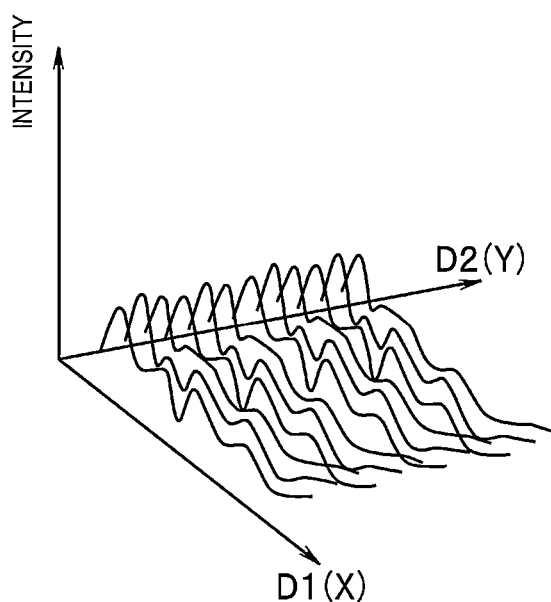
FIG. 19 is a view showing an example of a reconstructed two-dimensional image of the subject.

Meanwhile, in S8, when the difference d(x) is within the predetermined allowable error range (S8, YES), a two-dimensional image intensity distribution is acquired by arranging the finally obtained image intensity distribution $a'_n(x)$ in the D2(Y) direction (S11). The grid interval (resolution) of the obtained two-dimensional image intensity distribution is $v\Delta t$ in the X direction and LP in the Y direction. When $v\Delta t$ and LP are set to be the same and both are set to be sufficiently smaller values than L, the obtained resolution of the two-dimensional image intensity distribution is sufficiently smaller than L. As described above, the two-dimensional image of the subject 41 shown in FIG. 19 is reconstructed, and a series of procedures related to the image generation method according to the first embodiment end. FIG. 19 is a view showing an example of a reconstructed two-dimensional image of the subject.

As a method of acquiring a reconstructed image by detecting the intensity of X-rays transmitted through the subject 41 with a one-dimensional detector having linear pixels, a method of reconstructing a two-dimensional image by acquiring one-dimensional image intensity distribution while rotating the subject 41 is given as a comparative example. In the comparative example, when detecting the intensity of X-rays being transmitted, it is necessary to rotate the subject 41 with high accuracy so that a central axis does not deviate. When the central axis deviates during rotation, X-ray photons are detected at pixels that are different from the pixels that should be originally detected. Since the image intensity distribution is integrated based on the pixel position, correct integration cannot be performed when a rotation axis is deviated, and the accuracy of the reconstructed image is lowered. On the other hand, the imaging device according to the embodiment acquires the intensity distribution by scanning the subject 41 along the longitudinal direction of the linear pixels without rotating the subject 41, and acquires the reconstructed image with a deconvolution. Therefore, the reconstructed image can be acquired with higher accuracy than in the comparative example. In addition, the error included in $A_n(u)$, which is the Fourier transform of the image intensity distribution $a_n(x)$ acquired by the first linear pixel 142 can be corrected by the integrated intensity distribution r(x) of the second linear pixel 151. Therefore, a more highly accurate two-dimensional image intensity distribution can be acquired.

As described above, according to the imaging device according to the embodiment, while scanning the subject 41 along the longitudinal direction of the first linear pixel 142 disposed in the one-dimensional detector 14, the intensity distribution of X-rays being transmitted is acquired and the reconstructed image is acquired with a deconvolution. Since it is not necessary to rotate the subject 41 when acquiring the intensity distribution, positional deviation (deviation of the rotation axis) does not occur when scanning the subject 41, so that the reconstructed image can be generated with high accuracy. In addition, since it is not necessary to rotate the subject 41, a mechanism for driving the stage 22 can be simplified, and the size and cost of the device can be reduced.

Further, according to the imaging device of the embodiment, the second linear pixel 151 is also provided in addition to the first linear pixel 142. A longitudinal direction of the second linear pixel 151 is disposed to be orthogonal to a scanning direction of the subject 41. The integrated intensity distribution r(x) of the second linear pixel 151 has few variations and does not include an error due to a deconvolution. Therefore, the error included in $A_n(u)$, which is the Fourier transform of the image intensity distribution $a_n(x)$ acquired by the first linear pixel 142 can be corrected by the integrated intensity distribution r(x). Therefore, a more highly accurate two-dimensional image intensity distribution can be acquired.

Although the above embodiment assumes a transmission X-ray microscope, any device that acquires an image of the subject 41 may be used. Also, while the above embodiment explains an example in which the stage is moved, the detector may be moved in the direction of D1.

Second Embodiment

Next, a second embodiment will be described. The configuration of the one-dimensional detector 14 in the imaging device of the second embodiment is different from the configuration of the one-dimensional detector 14 in the first embodiment described above. The same elements as those in the first embodiment are denoted by the same reference numerals, and the description thereof will be omitted. Hereinafter, points different from the first embodiment will be described.

Figure 20A:
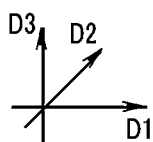
FIG. 20A is a schematic view showing a configuration of a one-dimensional detector in a second embodiment.
Figure 20B:
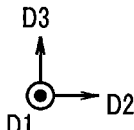
FIG. 20B is a sectional view taken along line B-B' of the one-dimensional detector shown in FIG. 20A.

FIG. 20A is a schematic view showing a configuration of a one-dimensional detector in a second embodiment. FIG. 20B is a sectional view taken along line B-B' of the one-dimensional detector shown in FIG. 20A.

As shown in FIG. 20A, the one-dimensional detector 14 includes the substrate 130 and two pixel layers (first pixel layer 140 and second pixel layer 170). The first pixel layer 140 is formed on the substrate 130 made of silicon or the like, and the second pixel layer 170 is formed above the first pixel layer 140. Configurations of the first pixel layer 140 are the same as those in the first embodiment. That is, the first pixel layer 140 is configured by arranging N first linear pixels 142_1 to 142_N extending in the D1 direction at equal intervals in the D2 direction in the first pixel layer 140. The second pixel layer 170 is configured by arranging N second linear pixels 171_1 to 171_N extending in the D1 direction at equal intervals in the D2 direction in the second pixel layer 170. When a length of the first linear pixel 142 is defined as $L_1$ and a length of the second linear pixel 171 is defined as $L_2$, $L_1$ and $L_2$ are set to different lengths. For example, in the example shown in FIG. 20A, $L_1 > L_2$.

As shown in FIG. 20B, the surface of the first linear pixel 142 is covered with the insulating film 160 formed of a silicon oxide film or the like. The second linear pixel 171 is formed on the upper surface of the insulating film 160. That is, the plurality of first linear pixels 142 constituting the first pixel layer 140 are electrically separated from each other by the insulating film 160. Further, the first linear pixel 142 and the second linear pixel 171 are physically and electrically separated by the insulating film 160. The position of the first linear pixel 142_n and the position of the second linear pixel 171_n ($1 \leq n \leq N$) in the D2 direction are the same, that is, the second linear pixel 171_n is disposed above the first linear pixel 142_n in the D3 direction.

Figure 20C:
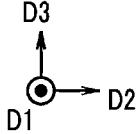
FIG. 20C is another sectional view taken along line B-B' of the one-dimensional detector shown in FIG. 20A.

FIG. 20C is another sectional view taken along line B-B' of the one-dimensional detector shown in FIG. 20A. At least, the first linear pixel 142 and the second linear pixel 171 may be physically and electrically separated by the insulating film 160. Therefore, the insulating film 160 need not be provided between the adjacent first linear pixels 142. For example, as shown in FIG. 20C, the insulating film 160 need not be formed on the substrate 130 on which the first linear pixel 142 is not formed.

Figure 21:
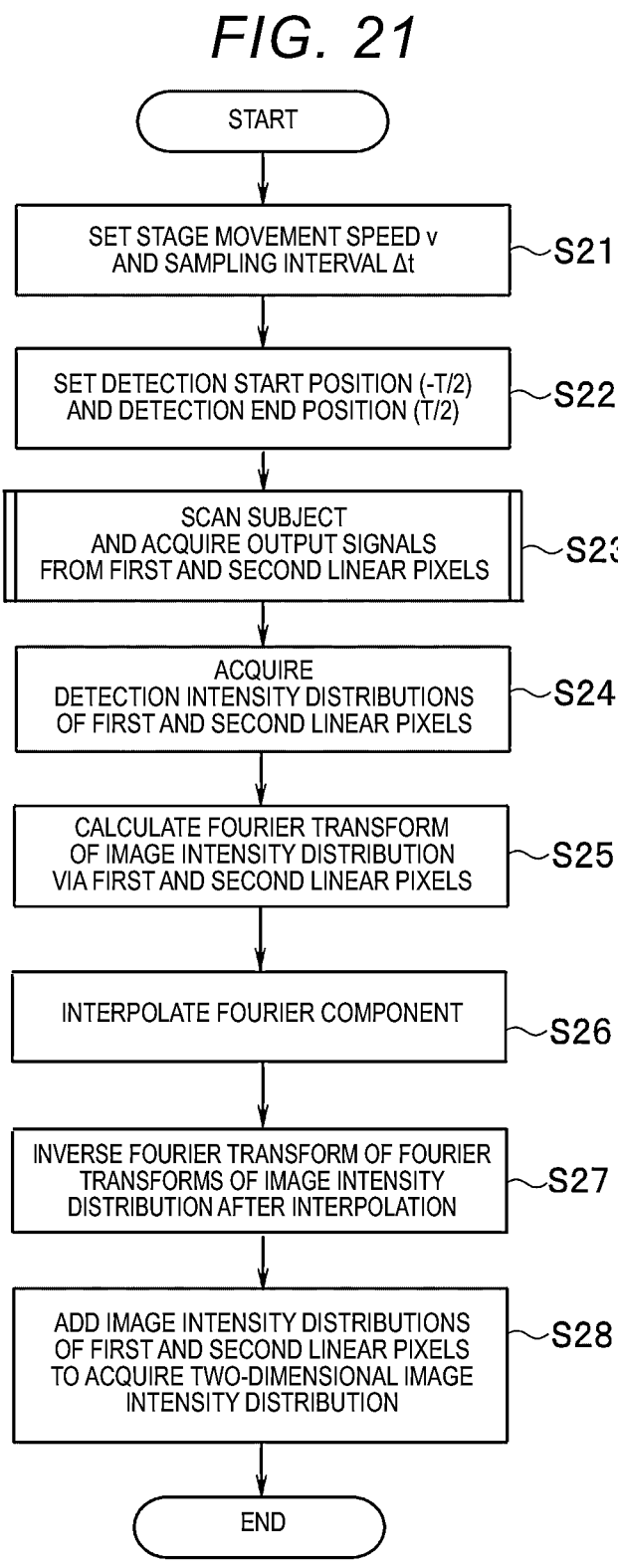
FIG. 21 is a flowchart showing an example of an image generation method according to the second embodiment.

Next, an image generation method using the above-described imaging device will be described. FIG. 21 is a flowchart showing an example of an image generation method according to the second embodiment. First, the subject 41 is placed on the stage 22, and the movement speed v of the stage 22 and the sampling interval $\Delta t$ are set (S21). Then, the detection start position (−T/2) and the detection end position (T/2) are set (S22). Specifically, on the subject 41, for the X-coordinate position (=x) at which the X-rays incident on the center 147 of the detection body 141 on the subject 41 are transmitted through, a position at a time point of the start of detection and a position at a time point of the end of detection are set. Subsequently, the subject 41 is scanned, and the control analysis unit 31 acquires the output signals (detection intensities) from the first linear pixel 142 and the second linear pixel 171 (S23).

Next, the cumulative number of X-ray photons detected in the first linear pixel 142 or the second linear pixel 171 during a certain sampling interval $\Delta t$ is set as the intensity, and the detection intensity distribution $i_{1n}$ (x) in which the intensity detected in the first linear pixel 142_$n$ is plotted and the detection intensity distribution $i_{2n}$(x) in which the intensity detected in the second linear pixel 171_$n$ is plotted are acquired for all the pixels ($1 \leq n \leq N$) with respect to the X coordinate corresponding to the center 147 of the detection body 141. When the detection efficiency of the first linear pixel 142 and the detection efficiency of the second linear pixel 171 are different from each other, $i_{1n}$ (x) is corrected by multiplying $i_{1n}$ (x) by a ratio of the detection efficiency of the second linear pixel 171 to the detection efficiency of the first linear pixel 142 (S24).

Subsequently, the Fourier transforms $Ii_{1n}$(u), $I_{2n}$(u), $W_1$ (u), and $W_2$ (u) of the detection intensity distributions $i_{1n}$ (x) and $I_{2n}$(x), the window functions $w_1$ (x) and $w_2$ (x) of the first linear pixel 142_$n$ and the second linear pixel 171_$n$ are obtained, and the Fourier transforms $A_{1n}$(u) and $A_{2n}$ (u) of the image intensity distribution are obtained using Equation (2) (S25).

When one of the Fourier components of the window functions of the first linear pixel 142 and the second linear pixel 171 at a certain spatial frequency is within a predetermined range in a vicinity of zero, the Fourier component of the image intensity distribution at the same spatial frequency is interpolated by the other Fourier component (S26). For example, the Fourier transform $W_1$(u) of the window function of the first linear pixel 142_$n$ has a Fourier component of zero when the spatial frequency is an integral multiple of $1/L_1$ assuming that the region of Fourier transform is 1. Therefore, in the Fourier transform $A_{1n}$(u) of the image intensity distribution of the first linear pixel 142_$n$, the Fourier component at the spatial frequency that is an integral multiple of $1/L_1$ is interpolated with the Fourier component at the same spatial frequency of the Fourier transform $A_{2n}$(u) of the image intensity distribution of the second linear pixel 171_$n$.

In addition, the Fourier transform $W_2$ (u) of the window function of the second linear pixel 171_$n$ has a Fourier component of zero when the spatial frequency is an integral multiple of $1/L_2$ assuming that the region of Fourier transform is 1. Therefore, in the Fourier transform $A_{2n}$ (u) of the image intensity distribution of the second linear pixel 171_$n$, the Fourier component at the spatial frequency that is an integral multiple of $1/L_2$ is interpolated with the Fourier component at the same spatial frequency of the Fourier transform $A_{1n}$(u) of the image intensity distribution of the first linear pixel 142_$n$. At this time, it is desirable that the integral multiple of $1/L_1$ and the integral multiple of $1/L_2$ do not overlap as much as possible, and for example, when $L_1$ and $L_2$ are integers, $L_1$ and $L_2$ which are relatively prime to each other are selected.

Next, the image intensity distribution $a'_{1n}$(x) and the image intensity distribution $a'_{2n}$(x) are obtained by inverse Fourier transform of the Fourier transforms $A_{1n}$(u) and $A_{2n}$ (u) of the image intensity distribution after interpolation (S27). The obtained image intensity distribution $a'_{1n}$(x) and the image intensity distribution $a'_{2n}$ (x) are added together and arranged in the D2(Y) direction to acquire a two-dimensional image intensity distribution (S28). As described above, the two-dimensional image of the subject 41 is reconstructed, and a series of procedures related to the image generation method according to the second embodiment end.

As described above, according to the imaging device of the embodiment, the first linear pixel 142_$n$ and the second linear pixel 171_$n$ having different lengths are stacked so that the longitudinal directions are parallel to each other to constitute the one-dimensional detector 14. As a result, the spatial frequencies at which errors occur in the Fourier components in $A_{1n}$(u) and $A_{2n}$(u), that is, the spatial frequencies at which the Fourier components of the window function are zero, can be shifted from each other. Therefore, by interpolating the Fourier component of $A_{1n}$(u) (or $A_{2n}$(u)) at the spatial frequency at which the Fourier component of the window function is zero with the Fourier component of $A_{2n}$(u) (or $A_{1n}$(u)) at the same spatial frequency, the errors of both $A_{1n}$(u) and $A_{2n}$(u) can be reduced. Therefore, it is possible to acquire a highly accurate two-dimensional image intensity distribution without requiring an operation such as rotation.

In the present example, when the difference between $L_1$ and $L_2$ is set as $v\Delta t$, it is also possible to obtain the image intensity distribution a (x) without using a deconvolution from the difference between the detection intensity distribution $i_{1n}$(x) and the detection intensity distribution $I_{2n}$(x).

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. An imaging device comprising:

a stage configured to hold a subject;

a detector including a first pixel layer, an insulating layer, and a second pixel layer stacked on top of one another;

an image formation optical member configured to form an image of imaging light transmitted through the subject; and an image processor configured to reconstruct an image of the subject based on a detection intensity of the imaging light detected by the detector, wherein the first pixel layer includes a plurality of first linear pixels having linear light receiving surfaces extending in a first direction, and the plurality of first linear pixels are arranged with equal intervals from one another in a direction orthogonal to the first direction, the second pixel layer includes a plurality of second linear pixels having linear light receiving surfaces extending in a second direction, and the plurality of second linear pixels are arranged with equal intervals from one another in a direction orthogonal to the second direction, respective widths of the first linear pixel and the second linear pixel in the first direction are different from each other, the stage is scannable relatively with the detector in a direction parallel to the first direction, the detector is configured to output, for each sampling interval, a first detection intensity detected in the first pixel layer, and a second detection intensity detected in the second pixel layer, a distance that the stage is scanned at the sampling interval is shorter than a line length of the first linear pixel, and the image processor is further configured to:

assume that a first detection intensity distribution indicating the first detection intensity with respect to position coordinates of the stage is a convolution of a first image intensity distribution on a line extension line of the first linear pixel and a first window function showing 1 in a range of position coordinates of the stage corresponding to the line length of the first linear pixel and showing 0 in other ranges, and calculate the first image intensity distribution for each of the plurality of first linear pixels with a deconvolution from the first detection intensity distribution, correct the first image intensity distribution by using a second detection intensity distribution indicating the second detection intensity with respect to the position coordinates of the stage, and generate an image of the subject having a resolution in the first direction that is smaller than the line length of the first linear pixel by arranging the first image intensity distributions corrected in all the first linear pixels in an arrangement direction of the first linear pixels.

2. The imaging device according to claim 1, wherein the second direction is orthogonal to the first direction, and the image processor is further configured to correct the first image intensity distribution such that a difference between a first integrated intensity distribution, which is a sum of the first image intensity distributions in the first direction, and a second integrated intensity distribution, which is calculated from the second detection intensity distribution, is equal to or less than a predetermined value.

3. The imaging device according to claim 2, wherein the second integrated intensity distribution is calculated by a time delay integration (TDI) method.

4. The imaging device according to claim 2, wherein the image processor is further configured to specify a spatial frequency at which an absolute value of a Fourier component is maximum by performing a Fourier transform on a distribution of the difference, and adjust a Fourier transform of the first image intensity distribution such that the difference is reduced at the specified spatial frequency.

5. The imaging device according to claim 4, wherein the image processor is further configured to correct the first detection intensity distribution by using the second integrated intensity distribution, and perform the deconvolution by using the corrected first detection intensity distribution.

6. The imaging device according to claim 1, wherein the second direction is parallel to the first direction, and the image processor is further configured to:

determine that the second detection intensity distribution indicating the second detection intensity with respect to the position coordinates of the stage is a convolution of a second image intensity distribution on a line extension line of the second linear pixel and a second window function showing 1 in a range of position coordinates of the stage corresponding to a line length of the second linear pixel and showing 0 in other ranges, and calculate the second image intensity distribution for each of the linear pixels with a deconvolution from the second detection intensity distribution, interpolate a Fourier component of one detection intensity distribution at a certain spatial frequency with a Fourier component of the other detection intensity distribution when a Fourier component of either the first window function or the second window function at the certain spatial frequency is within a predetermined range in a vicinity of zero, when performing the deconvolution, and correct the first image intensity distribution by adding the second image intensity distribution to the first image intensity distribution obtained by the deconvolution.

7. An image generation method comprising:

irradiating a subject held on a stage with imaging light;

outputting, for each predetermined sampling interval via a detector, a first detection intensity of imaging light transmitted through the subject detected in a first pixel layer, and a second detection intensity of imaging light transmitted through the subject detected in a second pixel layer, wherein the detector includes the first pixel layer, an insulating layer, and the second pixel layer stacked on top of one another, and wherein the first pixel layer includes a plurality of first linear pixels having linear light receiving surfaces extending in a first direction, the plurality of first linear pixels are arranged with equal intervals from one another in a direction orthogonal to the first direction, the second pixel layer includes a plurality of second linear pixels having linear light receiving surfaces extending in a second direction, and the plurality of second linear pixels are arranged with equal intervals from one another in a direction orthogonal to the second direction, while scanning the stage relatively with the detector in the first direction at a predetermined speed, in which a distance that the stage is scanned at the predetermined sampling interval is shorter than a line length of the first linear pixel;

determining that a first detection intensity distribution indicating the first detection intensity with respect to position coordinates of the stage is a convolution of a first image intensity distribution on a line extension line of the first linear pixel and a first window function showing 1 in a range of position coordinates of the stage corresponding to the line length of the first linear pixel and showing 0 in other ranges, and calculating the first image intensity distribution for each of the plurality of first linear pixels with a deconvolution from the first detection intensity distribution;

correcting the first image intensity distribution by using a second detection intensity distribution indicating the second detection intensity with respect to the position coordinates of the stage; and generating an image of the subject having a resolution in the first direction that is smaller than the line length of the first linear pixel by arranging the first image intensity distributions corrected in all the first linear pixels in an arrangement direction of the first linear pixels.

* * * * *